(12) United States Patent
Ukeda

(10) Patent No.: US 10,026,910 B2
(45) Date of Patent: Jul. 17, 2018

(54) DISPLAY APPARATUS COMPRISING FLEXIBLE DISPLAY PANEL

(71) Applicant: Panasonic Intellectual Property Management Co., Ltd., Osaka (JP)

(72) Inventor: Takaaki Ukeda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 166 days.

(21) Appl. No.: 14/945,093

(22) Filed: Nov. 18, 2015

(65) Prior Publication Data

US 2016/0163779 A1 Jun. 9, 2016

(30) Foreign Application Priority Data

Dec. 3, 2014 (JP) ................. 2014-245352

(51) Int. Cl.
| | |
|---|---|
| *H01L 29/06* | (2006.01) |
| *H01L 29/08* | (2006.01) |
| *H01L 29/20* | (2006.01) |
| *H01L 33/00* | (2010.01) |
| *H01L 51/40* | (2006.01) |
| *H01J 1/62* | (2006.01) |
| *H01J 63/04* | (2006.01) |
| *H01L 51/00* | (2006.01) |
| *H01L 27/32* | (2006.01) |

(52) U.S. Cl.
CPC ...... *H01L 51/0097* (2013.01); *H01L 27/3213* (2013.01); *H01L 27/3241* (2013.01); *H01L 27/3281* (2013.01); *B60R 2300/202* (2013.01); *G09G 2380/02* (2013.01); *H01L 2251/5338* (2013.01); *Y02E 10/549* (2013.01)

(58) Field of Classification Search
CPC ............ H01L 51/0097; H01L 27/3213; H01L 27/3241; H01L 27/3244; H01L 27/3281; H01L 2251/5338; B60R 2300/202
USPC .... 257/40, 89, 99, E51.022; 438/34, 35, 99; 313/504
See application file for complete search history.

(56) References Cited

U.S. PATENT DOCUMENTS

2005/0052142 A1* 3/2005 Iwabuchi ............ H01L 27/3225
315/169.3
2007/0072154 A1 3/2007 Akatsuka et al.
(Continued)

FOREIGN PATENT DOCUMENTS

JP 2004-064131 2/2004
JP 2007-096638 4/2007
(Continued)

*Primary Examiner* — Fernando L Toledo
*Assistant Examiner* — Aaron Gray
(74) *Attorney, Agent, or Firm* — Greenblum & Bernstein, P.L.C.

(57) ABSTRACT

A display apparatus according to one aspect of the present disclosure includes at least one flexible display panel including a first picture element that emits a red light, a second picture element that emits a green light, a third picture element that emits a blue light, and a fourth picture element. Each of the first picture element, the second picture element, and the third picture element includes an organic electroluminescent element as a light source and is driven by an active matrix method. The fourth picture element includes an organic electroluminescent element as a light source and is driven by a passive method.

9 Claims, 12 Drawing Sheets

(56) References Cited

U.S. PATENT DOCUMENTS

| | | | | |
|---|---|---|---|---|
| 2007/0205423 A1* | 9/2007 | Yamazaki | ........... | H01L 27/3213 |
| | | | | 257/89 |
| 2008/0137275 A1 | 6/2008 | Tada | | |
| 2010/0244698 A1 | 9/2010 | Nakamura | | |
| 2015/0229844 A1* | 8/2015 | Yamazaki | .......... | H04N 5/23293 |
| | | | | 348/333.01 |
| 2016/0132281 A1* | 5/2016 | Yamazaki | ............. | G06F 3/1446 |
| | | | | 345/1.3 |

FOREIGN PATENT DOCUMENTS

| | | |
|---|---|---|
| JP | 2008-145840 | 6/2008 |
| JP | 2009-120144 | 6/2009 |
| JP | 2009-524910 | 7/2009 |
| JP | 2015-166856 | 9/2015 |
| WO | 2004/059600 | 7/2004 |
| WO | 2007/089506 | 8/2007 |

* cited by examiner

DISPLAY APPARATUS COMPRISING FLEXIBLE DISPLAY PANEL

BACKGROUND

1. Technical Field

The present disclosure relates to a flexible display apparatus, and more specifically, to a display apparatus to be attached to a structure such as a pillar section of a vehicle.

2. Description of the Related Art

Conventionally, an apparatus has been known that displays an image of surroundings, which are blind spots due to a pillar, a part of a vehicle frame, on a display device provided on the pillar (See, for example, Japanese Unexamined Patent Application Publication No. 2007-096638).

In addition, conventionally, in order to ensure safety of a vehicle occupant when he/she gets on or off a vehicle, lighting provided on an in-vehicle ceiling and lighting provided near a door are turned on when the door of the vehicle is opened or closed (See, for example, Japanese Unexamined Patent Application Publication No. 2009-120144).

SUMMARY

In one general aspect, the techniques disclosed here feature a display apparatus including at least one flexible display panel including a first picture element that emits a red light, a second picture element that emits a green light, a third picture element that emits a blue light, and a fourth picture element, wherein each of the first picture element, the second picture element, and the third picture element is a picture element that includes an organic electroluminescent element as a light source and is driven by an active matrix method, and the fourth picture element is a picture element that includes an organic electroluminescent element as a light source and is driven by a passive method.

The display apparatus of the present disclosure can be attached to a pillar section and perform both image display and lighting.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION (Underlying Knowledge Forming Basis of the Present Disclosure)

Generally, in a vehicle, in-vehicle space is formed by means of a structure called a pillar. Glasses laid between pillars allow a vehicle occupant to recognize the conditions outside the vehicle.

However, the pillars are usually a structure having no light-transmitting property, which thus creates a blind spot in a part of a line of vision of the vehicle occupant. Since the vehicle occupant cannot recognize a pedestrian or the like located in the blind spot created by the pillar, this may involve the risk of causing an accident.

In contrast to this, as described in the Japanese Unexamined Patent Application Publication No. 2007-096638, there is known the technology of installing a display apparatus on a pillar (pillar section). In such a technology, a landscape of a blind spot due to the pillar section being displayed on the display apparatus installed in the pillar section, a vehicle occupant can recognize a pedestrian or the like located in the blind spot created by the pillar section. In fact, such a technology can enhance the safety.

Figure 1A:
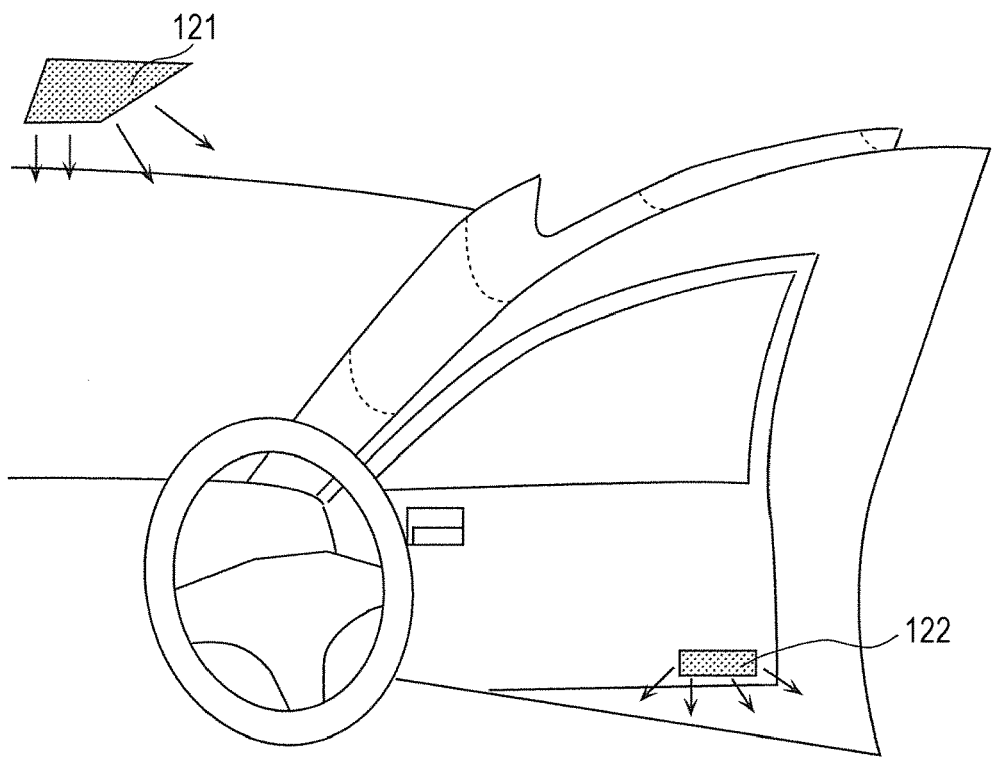
FIG. 1A is a first view showing arrangement of lighting provided in a vehicle.
Figure 1B:
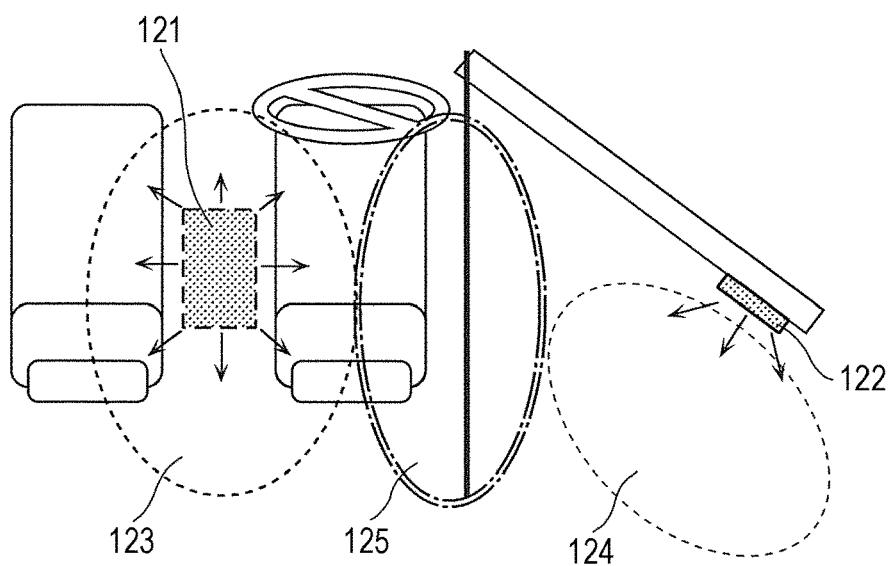
FIG. 1B is a second view (top view) showing the arrangement of the lighting provided in the vehicle.

On the one hand, the inventor believed that a vehicle is also challenged by a problem of safety when a vehicle occupant gets on or off the vehicle. FIG. 1A and FIG. 1B are views showing arrangement of lighting installed in the vehicle.

In general, inside of a compartment is illuminated by an interior light 121 provided on the ceiling and a foot light 122 installed on a door for illuminating foots when the vehicle occupant gets on or off. However, with only the interior light 121 and the foot light 122, adequate illuminance cannot be obtained when the vehicle occupant gets on or off at a dark place, in particular.

For example, FIG. 1B shows a region 123 illuminated by the interior light 121 and a region 124 illuminated by the foot light 122. Then, a region 125 that needs illuminance most when the vehicle occupant gets on or off cannot obtain adequate illuminance as it is shaded by the vehicle occupant and a seat. Hence, the inventors thought it desirable to install lighting on the pillar section of the vehicle in order to solve such a problem of illuminance.

Nevertheless, since the display apparatus and the lighting are independent devices, it is difficult to install both the display apparatus and the lighting onto the pillar section. Specifically, with the existing technology, it is difficult to simultaneously provide reduction of the blind spot created by the pillar section and installation of the lighting on the pillar section.

Then, focusing attention on a characteristic of self-luminous light of organic EL (electroluminescence), the inventor has got a new idea of solving these problems simultaneously.

Specifically, a display apparatus according to one aspect of the present disclosure includes at least one flexible display panel including a first picture element that emits a red light, a second picture element that emits a second light, a third picture element that emits a blue light, and a fourth picture element. Each of the first picture element, the second picture element, and the third picture element is a picture element that includes an organic electroluminescent element as a light source and is driven by an active matrix method, and the fourth picture element is a picture element that includes an organic electroluminescent element as a light source and is driven by a passive method.

The display apparatus of this aspect can be attached to a pillar section of a vehicle because it is flexible.

In addition, the display apparatus of this aspect can display an image by means of the first picture element, the second picture element, and the third picture element, and perform lighting by means of the fourth picture element which is driven by the different method.

In addition, in general, lighting requires higher intensity (brightness) than image display. A picture element mainly designed for lighting like the display apparatus of this aspect being driven differently from a picture element for image display, only the picture element for lighting can be driven independently, which thus makes it easy to ensure brightness of lighting.

In addition, in the display apparatus, the at least one flexible display panel may further includes: a first wire connected to the first picture element, the second picture element, and the third picture element; a second wire individually connected to each of the first picture element, the second picture element, and the third picture element; and a third wire connected to the fourth picture element. The display apparatus may be such that the at least one flexible display panel is configured to be provided to a pillar of the vehicle in a state of being curved along the pillar.

The display apparatus of this aspect can display on the pillar section an image obtained by shooting surroundings of the vehicle while it is running, and function as lighting when the vehicle occupant gets on or off.

In addition, the display apparatus may be such that the at least one flexible display panel is configured to be provided to the pillar in a state of being curved along a lateral direction of the pillar, and the first wire, the second wire, and the third wire extend to an end of the at least one flexible display panel in the lateral direction.

As such, the wires for causing each picture element to emit light being led out to the end of the lateral direction of the display panel, electrical connection of the display panel and a driving circuit (a board on which the driving circuit is provided) that drives the display panel is facilitated.

In addition, the display apparatus may be such that in the at least one flexible display panel, the first picture element, the second picture element, the third picture element, and the fourth picture element are arranged side by side in a longitudinal direction of the pillar, the first wire extends in the longitudinal direction, the second wire extends in the lateral direction, and the third wire extends in the longitudinal direction or the lateral direction.

In addition, the display apparatus may be such that in the at least one flexible display panel, the first picture element, the second picture element, the third picture element, and the fourth picture element are arranged side by side in the lateral direction, the first wire extends in the lateral direction, the second wire extends in the longitudinal direction of the pillar, and the third wire extends in the longitudinal direction or the lateral direction.

In addition, the display apparatus may be such that the first wire is a gate wire, the second wire is a data wire, and the third wire is a signal wire to supply electric power to the fourth picture element.

In addition, the display apparatus may be such that, in the at least one flexible display panel, a region where the first picture element, the second picture element, the third picture element, and the fourth picture element are provided is defined as a display region; and a region where the first picture element, the second picture element, the third picture element, and the fourth picture element are not provided and which is located at an end in the lateral direction is defined as a wiring region, and the first wire, the second wire, and the third wire extend to the wiring region.

In addition, the display apparatus may be such that the pillar is provided between a windshield and a door glass of the vehicle, the display region includes a first region being adjacent to the door glass and a second region being adjacent to the windshield, an area of the first region is equal to that of the second region, and an area of the fourth picture element in the first region is larger than that in the second region.

This enables the display apparatus to illuminate the region closer to the door glass brighter than the region closer to the windshield.

In addition, the display apparatus may be such that the wiring region is arranged within the pillar.

With this, since the wiring region is not exposed to the outside, design property can be improved. In addition, provision within the pillar section of the circuit board, on which a driving circuit is provided, facilitates connection of the display panel and the circuit board.

In addition, the display apparatus may be such that the at least one flexible display panel includes a plurality of flexible display panels, and at least a part of the wiring region of one of the plurality of flexible display panels is covered by the display region of another one of the plurality of flexible display panels.

In this manner, the display apparatus being formed of the plurality of display panels, the display apparatus can be attached to a structure having complicated curved surfaces. In addition, the wiring region of the one display panel being covered by the display region of another display panel, the display regions can be made continuous.

In addition, the display apparatus may be such that in the at least one flexible display panel, picture element units each including the first picture element, the second picture element, the third picture element, and the fourth picture element are arranged in a matrix.

In addition, the display apparatus may be such that the fourth picture element emits light in a same color as a single color that is obtainable by combining the red light emitted by the first picture element, the green light emitted by the second picture element, and the blue light emitted by the third picture element.

This enables such control that matches a color of light to be emitted by the entire picture elements for image display to the color of light emitted by the fourth picture element, when the display apparatus performs lighting by further causing the first picture element, the second picture element, and the third picture element to emit lights in addition to the fourth picture element.

Embodiments are described hereinafter specifically with reference to the drawings. Note that any of the embodiments to be described below shows a comprehensive or specific example. Any numeric value, shape, a material, a component, a location of an arranged component and connection form, a step, order of steps or the like, which are shown in the following embodiments, are by way of example, and not intended to limit the present disclosure. In addition, of components in the following embodiments, a component which is not described in an independent claim that represents a concept of the highest order is described as an optional component. Note that each figure is a schematic view and not necessarily shown to be exact.

Embodiment 1

First, an overview of a display apparatus according to an embodiment 1 is described with reference to FIG. 2A to FIG. 2D. FIG. 2A to FIG. 2D are views illustrating an overview of the display apparatus according to the embodiment 1. Note that FIG. 2A to FIG. 2D schematically show the inside of a compartment.

Figure 2A:
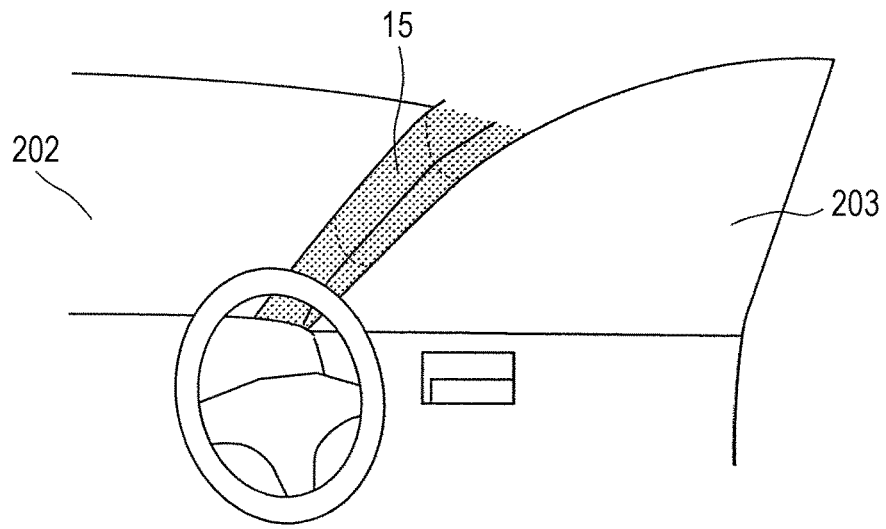
FIG. 2A is a first view illustrating an overview of a display apparatus according to an embodiment 1.

As shown in FIG. 2A, a pillar section 15 is provided at a front and lateral side of a driver seat in a compartment. The pillar section 15 is located between a windshield 202 and a door glass 203.

Figure 2B:
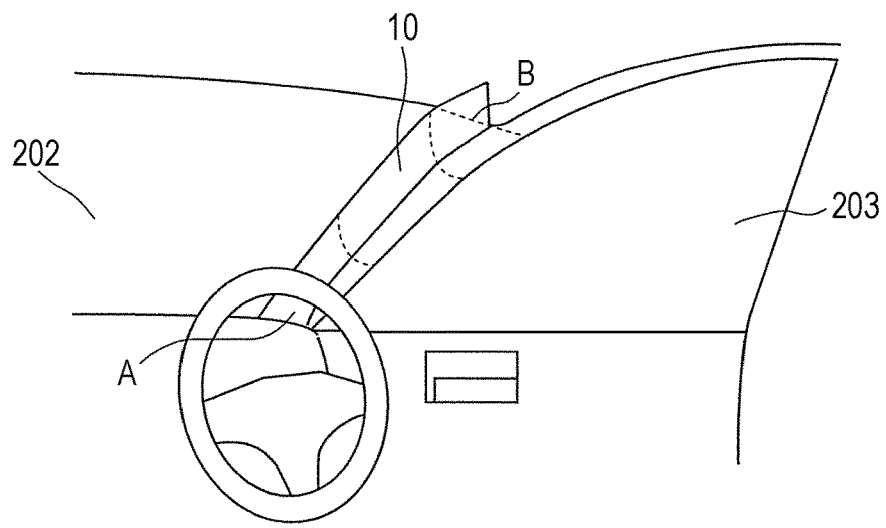
FIG. 2B is a second view illustrating the overview of the display apparatus according to the embodiment 1.

As shown in FIG. 2B, a display apparatus 10 according to the embodiment 1 is a flexible display apparatus and attached to the pillar section 15 of a vehicle in a state of being curved along the pillar section 15 as shown in FIG. 2A. More specifically, the display apparatus 10 is attached to the pillar section 15 so as to cover a surface of the pillar section 15 located in the compartment. Now, ends of the pillar section 15 in a longitudinal direction are defined as an end A and an end B. The end A is an end of the pillar section 15 on the side of a dashboard, while the end B is an end on the side of the ceiling.

In addition, the display apparatus 10 includes picture elements for image display and those for lighting.

Figure 2C:
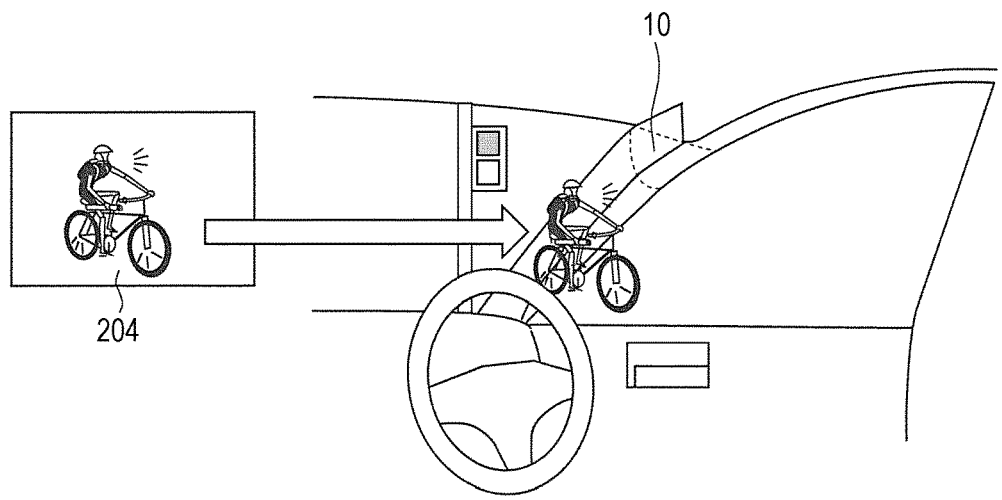
FIG. 2C is a third view illustrating the overview of the display apparatus according to the embodiment 1.

For example, as shown in FIG. 2C, the display apparatus 10 uses the picture elements for image display to display vehicle surrounding information (safety assistance information) that is generated based on images obtained by shooting the surroundings of a vehicle while it is running. Specifically, the vehicle surrounding information is an image 204 of a landscape of a blind spot created by a pillar. Since the image 204 is continuously superimposed on a landscape directly viewed through the windshield 202 and the door glass 203, the blind spot is reduced (cleared). Note that shooting of the surroundings of the vehicle is performed by an imaging unit (imager) provided in the vehicle.

Figure 2D:
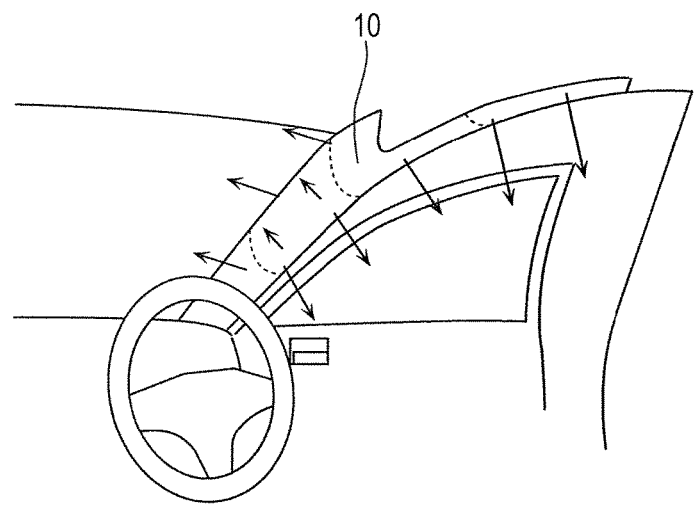
FIG. 2D is a fourth view illustrating the overview of the display apparatus according to the embodiment 1.

In addition, as shown in FIG. 2D, when a vehicle occupant gets on or off, the display apparatus 10 illuminates the inside of the compartment (the region 125 as illustrated in FIG. 1B, in particular) using the picture elements for lighting. More specifically, the display apparatus 10 performs lighting when the door of the vehicle is opened. Note that opening and closing of the vehicle door are sensed by a sensor provided in the vehicle.

As such, the display apparatus 10 can display an image while the vehicle is running and illuminate the inside of the vehicle when the vehicle door is open.

[Structure of a Display Apparatus]

Figure 3A:
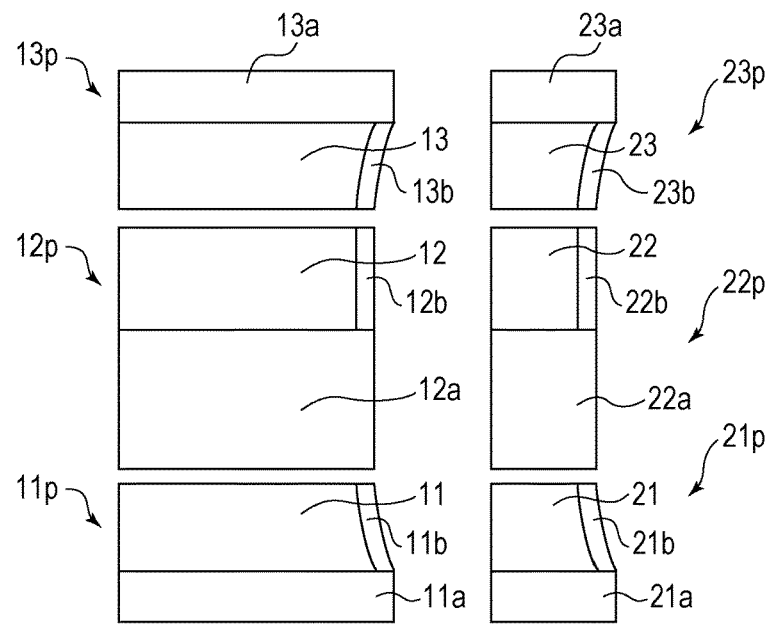
FIG. 3A is a first view illustrating a structure of the display apparatus according to the embodiment 1.
Figure 3B:
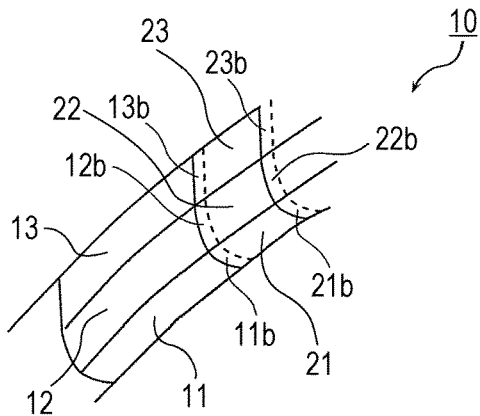
FIG. 3B is a second view illustrating the structure of the display apparatus according to the embodiment 1.
Figure 3C:
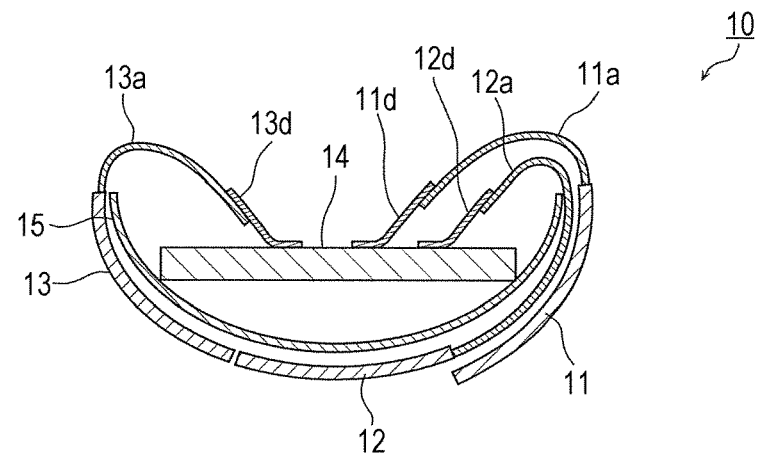
FIG. 3C is a third view illustrating the structure of the display apparatus according to the embodiment 1.

A structure of the display apparatus 10 is described below in detail. FIGS. 3A to 3C are views illustrating the structure of the display apparatus 10. Note that FIG. 3C is a sectional view of the display apparatus 10 attached to the pillar section 15 when it is cut on a plane perpendicular to the longitudinal direction of the pillar section 15.

The display apparatus 10 has a plurality of flexible display panels so that the display apparatus 10 can be attached to a structure having complicated curved surfaces (such as the pillar section 15). In FIG. 3A, parts of the display panels which constitute the display apparatus 10 (display panels 11p, 12p, 13p, 21p, 22p, and 23p) are schematically shown.

The display panel 11p includes a display region 11 where picture elements are arranged in a matrix, a wiring region 11a and a margin region 11b. Similarly, the display panel 12p includes a display region 12, a wiring region 12a, and a margin region 12b, and the display panel 13p includes a display region 13, a wiring region 13a, and a margin region 13b. This also applies to the display panels 21p, 22p, and 23p.

Note that of the display panel 11p, the wiring region 11a is a region where no picture element is provided and which is located at the end in the lateral direction of the pillar section 15. The margin region 11b is a region that serves as a margin where the display panels in the longitudinal direction of the pillar section 15 overlap.

As shown in FIG. 3B, each display panel is attached to the pillar section 15 so that only the display region of the display panel is exposed to the inside of the compartment. In addition, as shown in FIG. 3C, at least a part of the wiring region of each display panel is housed within the pillar section 15.

For example, as shown in FIGS. 3A to 3C, the ends of the wiring region 12a of the display panel 12p is housed within the pillar section 15, and a part (excluding the ends mentioned above) of the wiring region 12a of the display panel 12p is attached to the pillar section 15, being covered by a display region 22 of the other display panel 22p when viewed from the inside of the compartment. The display region 22 of the display panel 22p overlaps the margin region 12b of the display panel 12p. This also applies to the wiring region 22a and the margin region 22b of the display panel 22p.

In addition, the wiring region 11a of the display panel 11p is housed within the pillar section 15, and the display region 21 of the display panel 21p overlaps the margin region 11b. This also applies to the wiring region 21a and the margin region 21b of the display panel 21p.

A wiring region 13a of the display panel 13p is housed within the pillar section 15 and the display region 23 of the display panel 23p overlaps the margin region 13b. This also applies to the wiring region 23a and the margin region 23b of the display panel 23p.

Now, as shown in FIG. 3C, the wiring regions of the respective display panels housed within the pillar section 15 are electrically connected via FPCs (Flexible Printed Circuits) to a circuit board 14 which is provided within the pillar section 15. Specifically, the wiring region 11a is connected to the circuit board 14 via an FPC 11d, the wiring region 12a is connected to the circuit board 14 via an FPC 12d, and the wiring region 13a is connected to the circuit board 14 via an FPC 13d. Circuit components for driving and controlling respective display panels are implemented in the circuit board 14.

As described above, the display apparatus 10 being formed of the plurality of display panels, the display apparatus 10 can be arranged along the pillar section 15 even when a surface of the pillar section 15 is a complicated curved surface.

In addition, as described above, the wiring region of each display panel is covered by the display region of another display panel when viewed from the inside of the compartment. In other words, the wiring region of each display panel is housed within the pillar section 15. Such a configuration enables provision of the display apparatus 10 in which the display regions are seamlessly connected when viewed from the inside of the compartment.

[Arrangement of Picture Elements and a Wiring Structure of a Display Apparatus]

Figure 4:
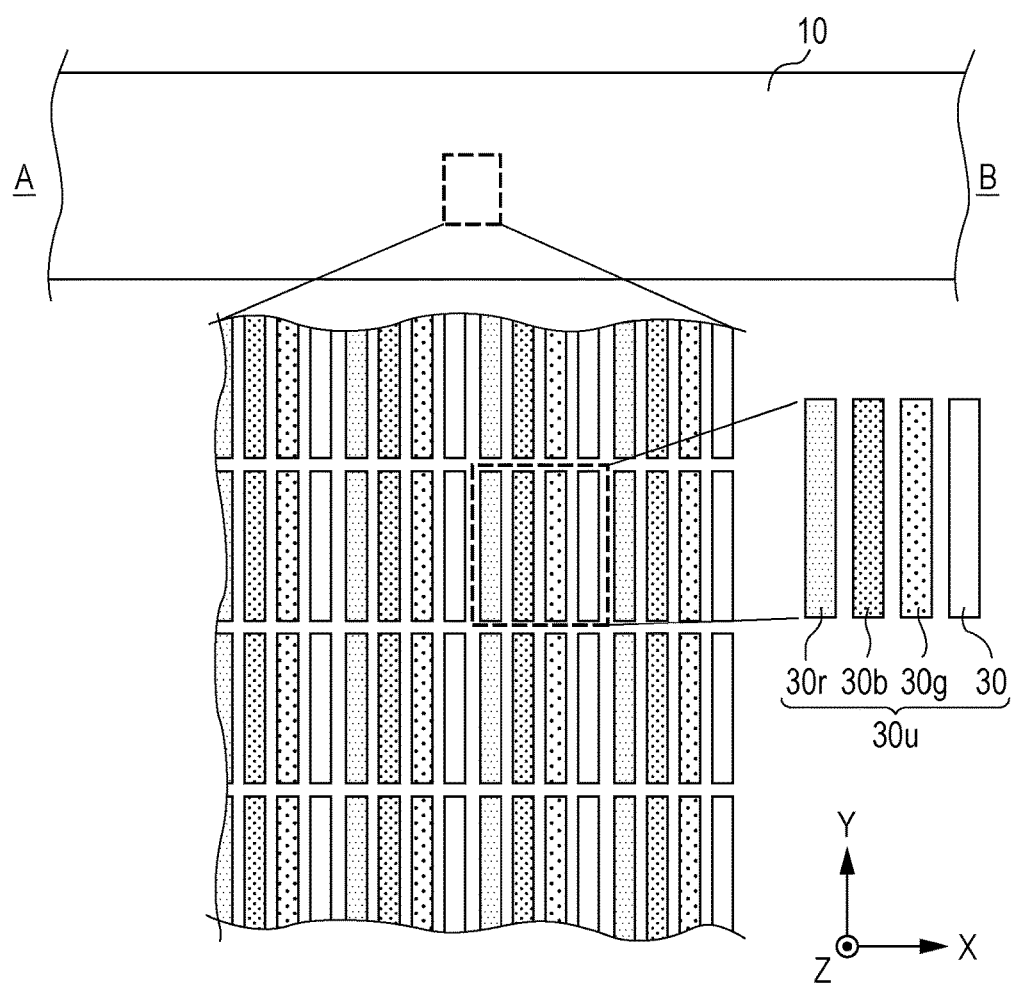
FIG. 4 is a view illustrating arrangement of picture elements of the display apparatus according to the embodiment 1.

Arrangement of picture elements and a wiring structure of a display apparatus 10 are described hereinafter. First, arrangement of picture elements of the display apparatus 10 is described. FIG. 4 is a view illustrating arrangement of picture elements of the display apparatus 10. Note that FIG. 4 is a view schematically illustrating the display apparatus 10 attached to a pillar section 15, and that an end A and an end B of FIG. 4 correspond to the end A and the end B of FIG. 2B. In addition, in the following description, a longitudinal direction of the pillar section 15 is stated as an X direction, and a lateral direction of the pillar section 15 is stated as a Y direction.

As shown in FIG. 4, in a display region of a display panel (display apparatus 10), long rectangular picture elements are arranged in a matrix (in an array) in the Y direction. The display panel of the display apparatus 10 includes, as picture elements for image display, a first picture element 30r, a second picture element 30g, a third picture element 30b, and a fourth picture element 30.

More specifically, in the display panel, a plurality of picture element units 30u each includes the first picture element 30r, the second picture element 30g, the third picture element 30b, and the fourth picture element 30 are arranged in the matrix. In one picture element unit 30u, the first picture element 30r, the third picture element 30b, the second picture element 30g, and the fourth picture element 30 are arranged side by side in this order in the longitudinal direction (X direction) of the pillar section 15. In addition, in the display panel, picture elements of a same type are continuously arranged side by side in the Y direction.

Note that the order of picture elements is not limited to such an order, and that the first picture element 30r, the second picture element 30g, the third picture element 30b, and the fourth picture element 30 may be arranged side by side in the X direction.

Here, the first picture element 30r is a picture element that emits a red light, the second picture element 30g is a picture element that emits a green light, and the third picture element 30b is a picture element that emits a blue light. These three types of picture elements have an organic EL element as a light source. Also, these three types of picture elements are picture elements for image display that have a thin-film transistor for selection and a thin-film transistor for driving, and that are driven by the active matrix method. Note that the organic EL element is a self light emitting device and emits light by itself by being given a desired driving current. Intensity of the organic EL element can be freely controlled, depending on the amount of currents running through the organic EL element.

The fourth picture element 30 is a picture element for lighting that has an organic EL element as a light source and is driven by the passive method. The fourth picture element 30 emits light in a same color as a single color that is obtainable by combining the red light emitted by the first picture element 30r, the green light emitted by the second picture element 30g, and the blue light emitted by the third picture element 30b. A color emitted by the fourth picture element 30 is not limited, in particular.

Figure 5A:
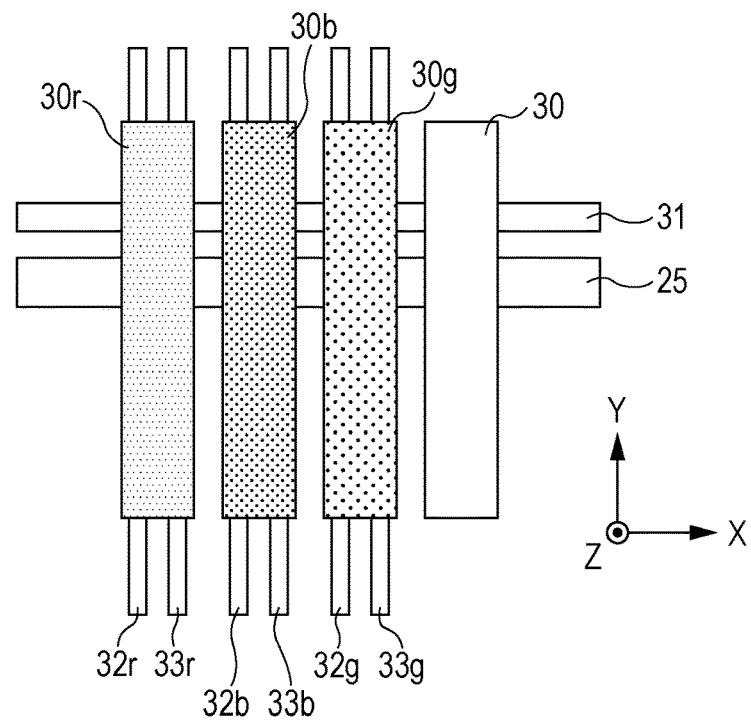
FIG. 5A is an enlarged view of a wiring structure on a display panel according to the embodiment 1.
Figure 5B:
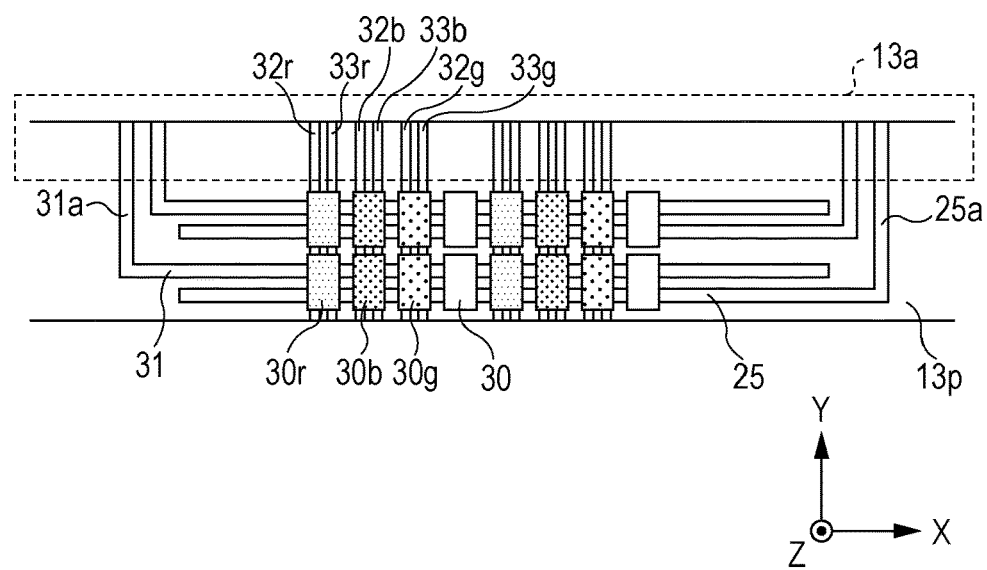
FIG. 5B is an overall view of the wiring structure on the display panel according to the embodiment 1.

A wiring structure for each picture element thus arranged is described hereinafter. FIG. 5A is an enlarged view of the wiring structure, and FIG. 5B is an overall view of the wiring structure in the display panel. Note that any of FIG. 5A and FIG. 5B is a schematic view for illustration and the dimensions, the number of picture elements, and the number of wires or the like are not accurate. In addition, in FIG. 5B, while the display panel 13p is shown by way of example, this also applies to the other display panels.

Figure 6:
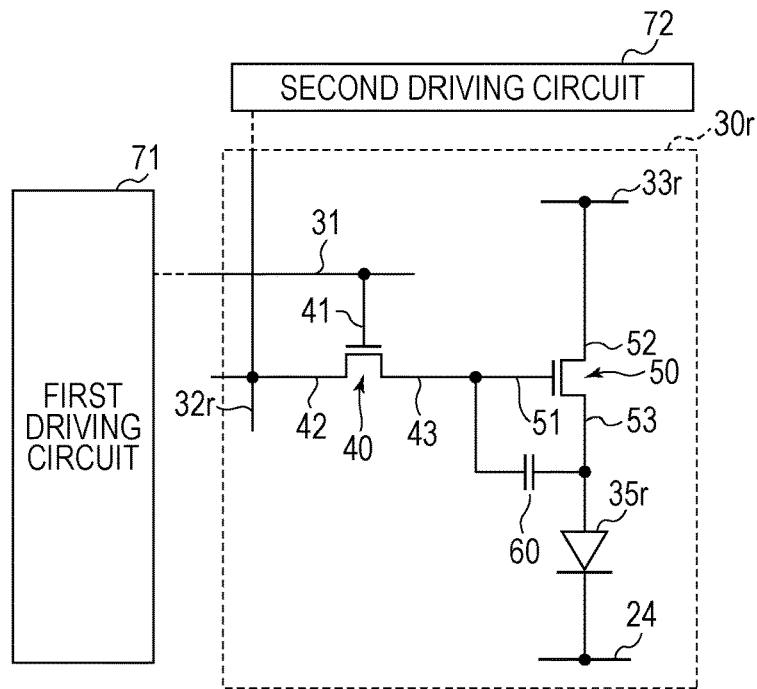
FIG. 6 is a circuit diagram of picture elements for image display.

First, a wiring structure corresponding to the first picture element 30r, the second picture element 30g, and the third picture element 30b is described further referring to a circuit diagram of the first picture element 30r. FIG. 6 is a circuit diagram of the first picture element 30r. A circuit diagram for the second picture element 30g and that for the third picture element 30b are similar, although they are not shown. In addition, the circuit shown in FIG. 6 is a picture element circuit of a minimum configuration in which two transistors and one capacitor are used for each picture element. Such a picture element circuit is an example, and a picture element circuit having more than two transistors and more than one capacitor may be used in the display apparatus 10 in order to stabilize illumination of the organic EL element.

As shown in FIG. 6, the first picture element 30r includes a selection transistor 40 (thin-film transistor for selection) that acts as a switching element, a driving transistor 50 (thin-film transistor for driving) that acts as a driving element, a capacitor 60 that stores data to be displayed in a corresponding picture element, and an organic EL element 35r.

The selection transistor 40 includes a gate electrode 41 connected to a gate wire 31, a source electrode 42 connected to a data wire 32r, and a drain electrode 43 connected to a capacitor 60 and a gate electrode 51 of a driving transistor 50. When a voltage is applied to the gate wire 31 and the data wire 32r, the selection transistor 40 causes the capacitor 60 to hold a value of the voltage applied to the data wire 32r as display data.

The driving transistor 50 includes the gate electrode 51 connected to the drain electrode 43 of the selection transistor 40, a drain electrode 52 connected to a power supply wire 33r, and a source electrode 53 connected to the anode of the organic EL element 35r. The driving transistor 50 supplies a current corresponding to the voltage value held by the capacitor 60, which is provided between the gate electrode 51 and the source electrode 53, from power supply wire 33r to the organic EL element 35r through the source electrode 53. With this, the organic EL element 35r emits light. A cathode of the organic EL element 35r is formed as an upper electrode 24 (not shown in FIG. 5A and FIG. 5B).

As such, the first picture element 30r (organic EL element 35r) is driven by the active matrix method. The second picture element 30g and the third picture element 30b are driven similarly. Note that a voltage applied to the gate wire 31 is controlled by a first driving circuit 71 and that a voltage applied to the data wire 32r is controlled by a second driving circuit 72. The first driving circuit 71 and the second driving circuit 72 are implemented on the circuit board 14 described above. The first driving circuit 71 and the second driving circuit 72 are implemented by a dedicated circuit (integrated circuit), a microcomputer, or a processor or the like.

Now, as shown in FIGS. 5A and 5B, the gate wire (specifically, the gate wire 31) is an example of a first wire which is a wire commonly connected to the first picture element 30r, the second picture element 30g, and the third picture element 30b and extending in the longitudinal direction (X direction) of the pillar section 15. The gate wire is a wire provided on each picture element row, and each of a plurality of picture elements belonging to one picture element row is electrically connected to one gate wire.

The data wire (specifically, the data wire 32r) is an example of a second wire which is a wire individually connected to each of the first picture element 30r, the second picture element 30g, and the third picture element 30b and extending in the lateral direction (Y direction) of the pillar section 15.

Specifically, the data wire 32r is commonly connected to a plurality of the first picture elements 30r (picture element column) arranged side by side in the Y direction and not connected to the second picture element 30g and the third picture element 30b. This also applies to a data wire 32g and a data wire 32b. More specifically, a data wire is a wire provided on each picture element column, and each of a plurality of picture elements belonging to one picture element column is electrically connected to one data wire.

The power supply wire (specifically, the power supply wire 33r) is a wire that is individually connected to each of the first picture element 30r, the second picture element 30g, and the third picture element 30b and extends in the Y direction.

Specifically, the power supply wire 33r is commonly connected to the plurality of first picture element 30r (picture element column) arranged side by side in the Y direction and not connected to the second picture element 30g and the third picture element 30b. This also applies to a power supply wire 33g and a power supply wire 33b. More specifically, the power supply wire is a wire provided on each picture element column, and each of a plurality of picture elements belonging to one picture element column is electrically connected to one power supply wire.

Such gate wire, data wire, and power supply wire are led out to the end in the lateral direction (Y direction) of the display panel 13p, that is to say, the wiring region 13a. For example, connected to a lead-out wire 31a that extends in the Y direction, the gate wire 31 is led out to the wiring region 13a. Note that while in FIG. 5B, the lead-out wire 31a is arranged at the end in the X direction of the display panel 13p, such arrangement of the lead-out wire 31a is an example and the arrangement is not limited, in particular.

Figure 7:
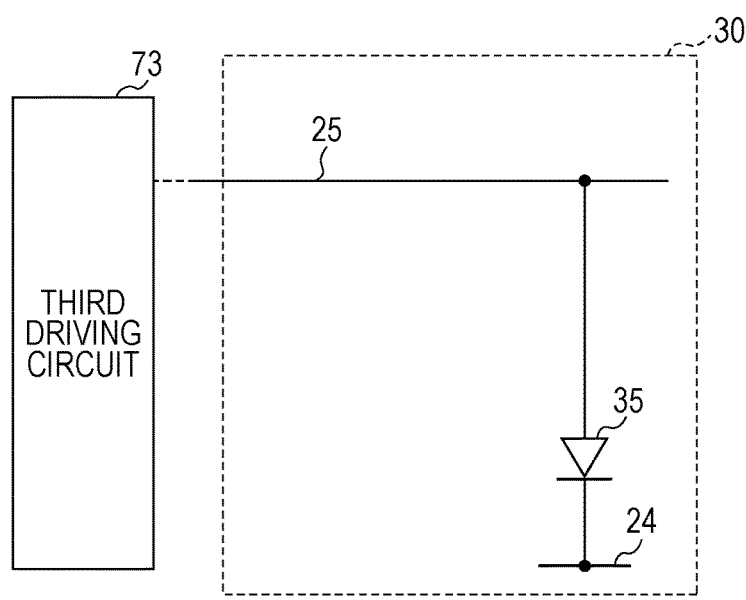
FIG. 7 is a circuit diagram of picture elements for lighting.

A wiring structure corresponding to the fourth picture element 30 is described hereinafter further referring to a circuit diagram of the fourth picture element 30, in addition to FIGS. 5A and 5B. FIG. 7 is a circuit diagram of the fourth picture element 30.

As shown in FIG. 7, the fourth picture element 30 includes the organic EL element 35, the anode of which is connected to a signal wire 25 and the cathode of which is formed as the upper electrode 24.

The organic EL element 35 emits light depending on a current (voltage) supplied from a third driving circuit 73 implemented on the circuit board 14. More specifically, the fourth picture element 30 (organic EL element 35) is driven by the passive method. Note that the third driving circuit 73 is implemented by a dedicated circuit (integrated circuit), a microcomputer, or a processor or the like.

Here, as shown in FIGS. 5A and 5B, the signal wire (specifically, the signal wire 25) is an example of a third wire which is a wire connected to the fourth picture element 30 and extending in the longitudinal direction (X direction) of the pillar section 15. More specifically, a signal wire is a wire provided on each picture element row, and each of a plurality of the fourth picture elements 30 belonging to one picture element row is electrically connected to one signal wire.

The signal wire is led out to the end in the lateral direction (Y direction) of the display panel 13p, that is to say, to the wiring region 13a. For example, the signal wire 25 is connected to a lead-out wire 25a, which extends in the X direction, and led out to the wiring region 13a. Note that while in FIG. 5B, the lead-out wire 25a is arranged at the end in the X direction of the display panel 13p, such arrangement of the lead-out wire 25a is an example and that the arrangement is not limited, in particular.

Figure 8:
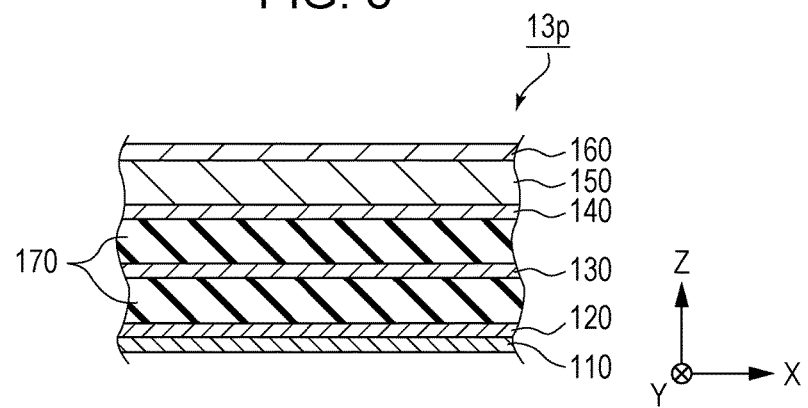
FIG. 8 is a schematic sectional view when the display panel according to the embodiment 1 is cut on a Z-X plane.

A supplementary description to a three-dimensional structure of wiring as described above is given hereinafter. FIG. 8 is a schematic cross sectional view when the display panel 13p is cut on the Z-X plane.

In the display panel 13p, a gate electrode layer 120 provided with a gate wire and a signal wire is provided on a TFT board 110. A source drain electrode layer 130 is provided above the gate electrode layer 120 via an insulation layer 170.

A data wire and a power supply wire are provided on the source drain electrode layer 130. In this manner, layers provided with wiring differ between the gate wire and the signal wire which extend in the Y direction and the data wire and the power supply wire which extend in the X direction, and cross each other at multi-levels.

A lower electrode layer 140 is provided above the source drain electrode layer 130 via the insulation layer 170. An EL layer 150 is provided on the lower electrode layer 140, and the upper electrode layer 160 is provided on the EL layer 150.

The lower electrode layer 140, the EL layer 150, and the upper electrode layer 160 are layers that constitute the organic EL element. The lower electrode layer 140 is an electrode layer corresponding to the anode of the organic EL element, and the upper electrode layer 160 is a layer corresponding to the cathode of the organic EL element. Note that the upper electrode 24 described above is provided on the upper electrode layer 160.

Note that the signal wire may be provided as a wire extending in the Y direction on the source drain electrode layer 130 or the lower electrode layer 140. More specifically, the signal wire may be a wire connected to the fourth picture element 30 and extending in the longitudinal direction of the pillar section 150 or the lateral direction of the pillar section 150.

[Summary]

As described above, the display apparatus 10 according to the embodiment 1 includes a flexible display panel (the display panel 13p, for example) having the first picture element 30r that emits a red light, the second picture element 30g that emits a green light, the third picture element 30b that emits a blue light, and the fourth picture element 30. Here, each of the first picture element 30r, the second picture element 30g, and the third picture element 30b is a picture element for image display that has an organic EL element as a light source and is driven by the active matrix method. The fourth picture element 30 is a picture element for lighting that has an organic EL element as a light source and is driven by the passive method that does not use a transistor.

Such a display apparatus 10 is attached to the pillar section 15 and can perform both image display and lighting. In particular, since the fourth picture element 30 for lighting can be driven independent of picture elements for image display, the fourth picture element 30 for lighting can be illuminated brighter than the picture elements for image display. Therefore, there is an advantage that intensity necessary for lighting can be ensured easily.

In addition, in the display panel of the display apparatus 10 according to the embodiment 1, the first picture element 30r, the second picture element 30g, the third picture element 30b, and the fourth picture element 30 are arranged side by side in the longitudinal direction of the pillar section 15.

Here, the display panel includes a gate wire that is connected to the first picture element 30r, the second picture element 30g, and the third picture element 30b and extends in the above-mentioned longitudinal direction, and a data wire that is connected individually to each of the first picture element 30r, the second picture element 30g, and the third picture element 30b and extends in the above-mentioned lateral direction. The display panel also includes a signal wire (wire to supply electric power to the fourth picture element 30) that is connected to the fourth picture element 30 and extends in the above-mentioned lateral direction. Then, the gate wire, the data wire, and the signal wire are led out to the end in the above-mentioned lateral direction of the display panel.

In general, the pillar section 15 curves in the lateral direction at a certain curvature radius, and hardly curves in the longitudinal direction. For this reason, a configuration that each wire is led out to the end in the lateral direction of the display panel facilitates housing of the wiring region 13a within the pillar section 15 and electrical connection of the wiring region 13a (display panel 13p) with the circuit board 14 within the pillar section 15.

In addition, according to such picture element arrangement and wiring structure, a picture element row that extends along the longitudinal direction of the pillar section 15 is provided to enable the fourth picture element 30 to emit light and be controlled for each picture element row. In addition, since a picture element column in which the fourth picture elements 30 are continuously arranged extends in the lateral direction of the pillar section 15, a long light emitting region can be provided in the lateral direction of the pillar section 15.

When as with the embodiment 1, the pillar section 15 is provided between the windshield 202 and the door glass 203 of the vehicle, the fourth picture element 30 that does not illuminate the region 125 (as shown in FIG. 1B) is not required to emit light at high intensity. For example, if the intensity of the fourth picture element 30 close to the windshield 202 is too high, a vehicle occupant may feel it too glaring. In such a case, according to the picture element arrangement and the wiring structure of the embodiment 1, such control is possible that the intensity of a picture element row of the fourth picture elements 30 close to the windshield 202 is lowered, or emission of the fourth picture elements 30 close to the windshield 202 is prevented.

In addition, the display apparatus 10 according to the embodiment 1 includes a plurality of display panels, and each of the plurality of display panels is attached in a state of being curved to the pillar section 15.

This enables mounting to a pillar section 15 having complicated shape of the display apparatus 10 in the state of being curved along the pillar section 15.

In addition, in this case, one display panel (for example, the display panel 12p) is attached to the pillar section 15 with at least a part of a wiring region of the display panel being covered by a display region of another display panel (for example, the display panel 11p). Then, the wiring region of the display panel is housed within the pillar section 15.

With such a configuration, the display apparatus 10 whose display regions are seamlessly connected when viewed from the inside of the compartment is provided.

Embodiment 2

The arrangement of picture elements and the wiring structure described in the above-mentioned embodiment 1 is an example. In an embodiment 2 below, arrangement of picture elements and a wiring structure which differ from the embodiment 1 are described. Note that in the embodiment 2, any description overlapping the embodiment 1 is omitted.

[Arrangement of Picture Elements and a Wiring Structure of a Display Apparatus]

Figure 9:
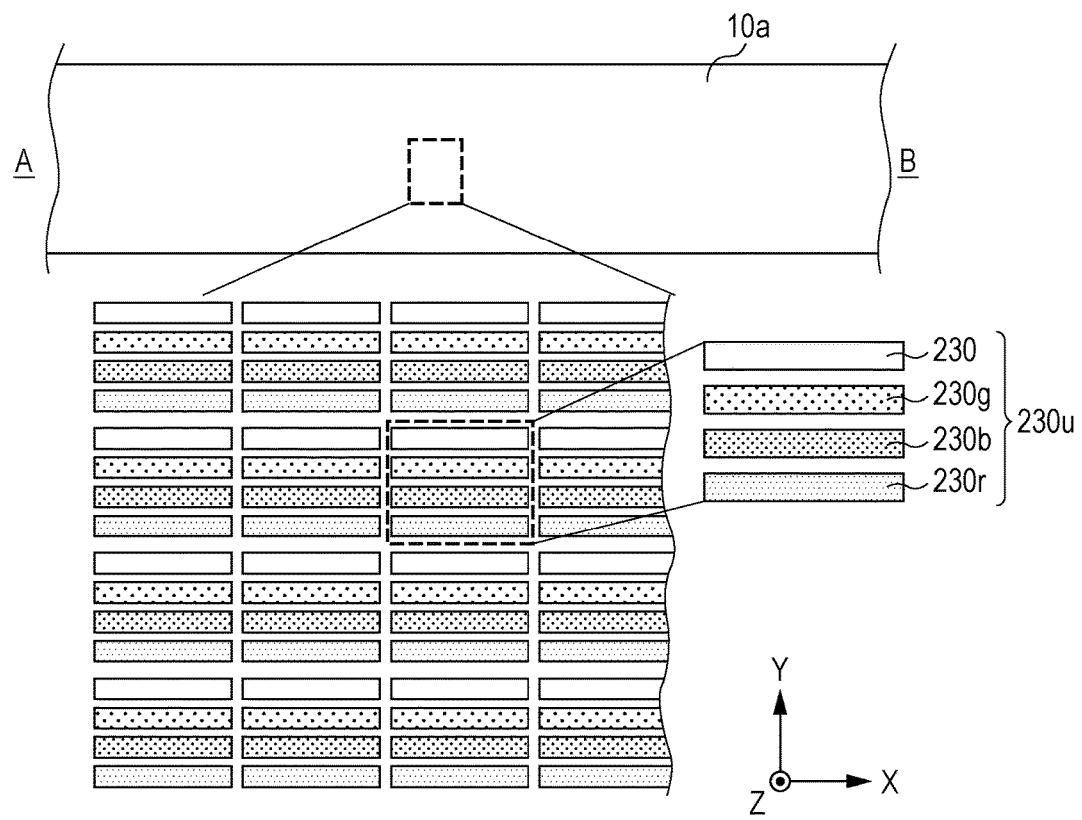
FIG. 9 is a view illustrating arrangement of picture elements of a display apparatus according to an embodiment 2.

FIG. 9 is a view illustrating arrangement of picture elements of a display apparatus according to the embodiment 2. FIG. 9 is a view schematically showing a display apparatus 10a attached to a pillar section 15, and an end A and an end B in FIG. 9 correspond to the end A and the end B in FIG. 2B. Note that in the description below, a longitudinal direction of the pillar section 15 is stated as an X direction, and a lateral direction of the pillar section 15 is stated as a Y direction.

As shown in FIG. 9, in a display region of a display panel of the display apparatus 10a, long rectangular picture elements are arranged in a matrix (in an array) in the X direction. More specifically, a plurality of picture element units 230u each including a first picture element 230r, a second picture element 230g, a third picture element 230b, and a fourth picture element 230 are arranged in a matrix.

In one picture element unit 230u, the first picture element 230r, the third picture element 230b, the second picture element 230g, and the fourth picture element 230 are arranged side by side in this order in the lateral direction (Y direction) of the pillar section 15. Also in the display panel, picture elements of a same type are continuously arranged side by side in the X direction.

The first picture element 230r is a picture element that emits a red light, the second picture element 230g is a picture element that emits a green light, and the third picture element 230b is a picture element that emits a blue light. The fourth picture element 230 is a picture element for lighting. These picture elements are respectively similar to the first picture element 30r, the second picture element 30g, the third picture element 30b, and the fourth picture element 30 of the embodiment 1.

Note that the order of picture elements is not limited to such an order, and that the first picture element 230r, the second picture element 230g, the third picture element 230b, and the fourth picture element 230 may be sequentially arranged side by side in the Y direction.

Figure 10A:
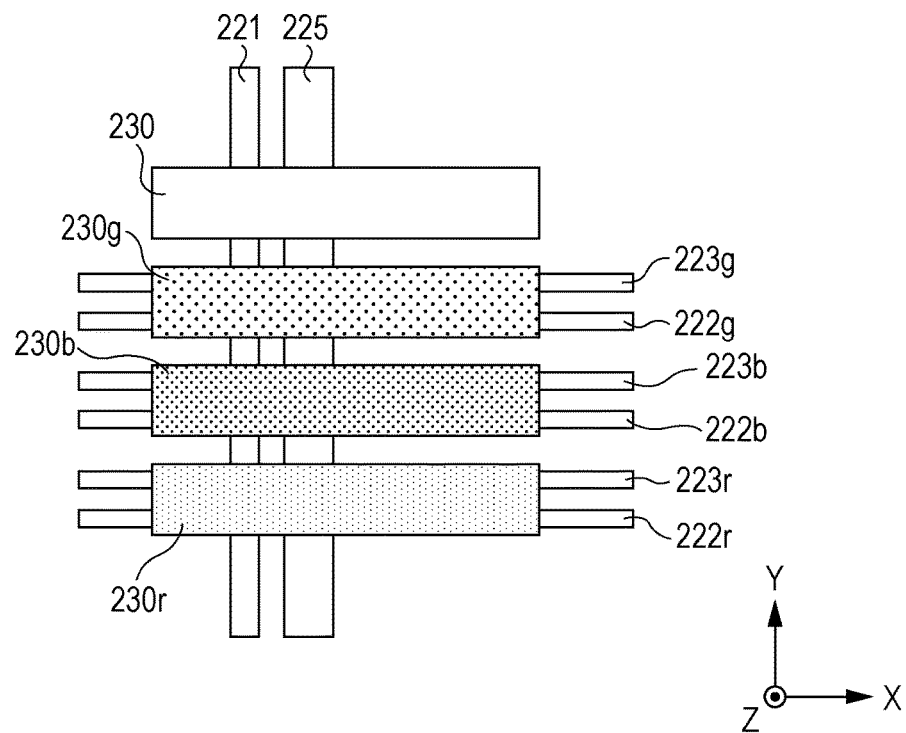
FIG. 10A is an enlarged view of a wiring structure on a display panel according to the embodiment 2.
Figure 10B:
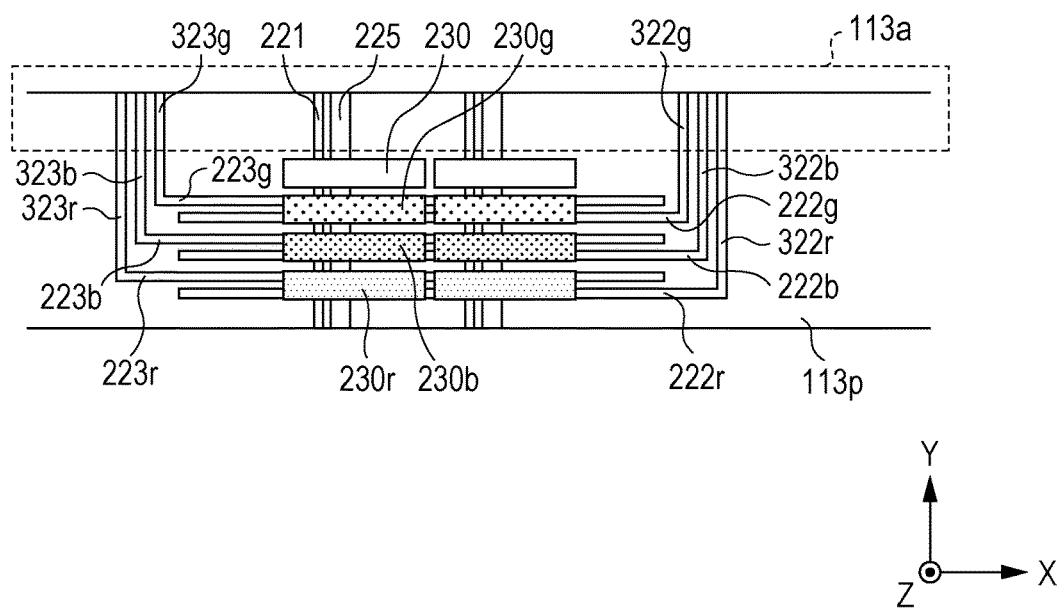
FIG. 10B is an overall view of the wiring structure on the display panel according to the embodiment 2.

A wiring structure to respective picture elements thus arranged is described hereinafter. FIG. 10A is an enlarged view of the wiring structure, and FIG. 10B is an overall view of the wiring structure in the display panel. Note that any of FIGS. 10A and 10B is a schematic view for illustration, and that dimensions, the number of picture elements, and the number of wires or the like are not accurate. In addition, in FIG. 10B, a display panel 113p, which is one of display panels that the display apparatus 10a includes is shown.

A gate wire (specifically, a gate wire 221) is an example of a first wire, which is a wire commonly connected to the first picture element 230r, the second picture element 230g, and the third picture element 230b and extending in the lateral direction (Y direction) of the pillar section 15. A gate wire is a wire provided on each picture element row, and each of a plurality of picture elements belonging to one picture element row is electrically connected to one gate wire.

A data wire (specifically, a data wire 222r) is an example of a second wire which is a wire individually connected to each of the first picture element 230r, the second picture element 230g, and the third picture element 230b and extending in the longitudinal direction (X direction) of the pillar section 15.

Specifically, the data wire 222r is commonly connected to a plurality of the first picture elements 230r (picture element column) arranged side by side in the X direction and not connected to the second picture element 230g and the third picture element 230b. This also applies to a data wire 222g and a data wire 222b. More specifically, a data wire is a wire provided on each picture element column, and each of a plurality of picture elements belonging to one picture element column is electrically connected to one data wire.

A power supply wire (specifically, a power supply wire 223r) is a wire individually connected to each of the first picture element 230r, the second picture element 230g, and the third picture element 230b, and extending in the X direction.

Specifically, the power supply wire 223r is commonly connected to the plurality of first picture element 230r (picture element column) arranged side by side in the X direction and not connected to the second picture element 230g and the third picture element 230b. This also applies to a power supply wire 223g and a power supply wire 223b. More specifically, the power supply wire is a wire provided on each picture element column, and each of a plurality of picture elements belonging to one picture element column is electrically connected to one power supply wire.

A signal wire (specifically, a signal wire 225) is an example of a third wire which is a wire connected to the fourth picture element 230 and extends in the lateral direction (Y direction) of the pillar section 15. A signal wire is a wire provided on each picture element row, and each of a plurality of the fourth picture elements 230 belonging to one picture element row is electrically connected to one signal wire. Note that similar to the embodiment 1, the signal wire may be a wire extending in the X direction. Specifically, the signal wire may be a wire connected to the fourth picture element 230 and extending in the longitudinal direction of the pillar section 15 or the lateral direction of the pillar section 15.

Such gate wire, data wire, power supply wire, and signal wire are led out to the end in the lateral direction (Y direction) of the display panel 113p, that is to say, the wiring region 113a.

For example, the data wire 222r, the data wire 222g, and the data wire 222b are led out to the wiring region 113a by being respectively connected to a lead-out wire 322r, a lead-out wire 322g, and a lead-out wire 322b that extend in the Y direction. In addition, the power supply wire 223r, the power supply wire 223g, and the power supply wire 223b are led out to the wiring region 113a by being respectively connected to a lead-out wire 323r, a lead-out wire 323g, and a lead-out wire 323b that extend in the Y direction. Note that in FIG. 10B, while each lead-out wire is arranged at the end in the X direction of the display panel 113p, such arrangement of the lead-out wires is an example, and that the arrangement is not be limited, in particular.

[Summary]

As described above, in the display panel (specifically, the display panel 113p) of the display apparatus 10a according to the embodiment 2, the first picture element 230r, the second picture element 230g, the third picture element 230b, and the fourth picture element 230 are arranged side by side in the lateral direction (Y direction) of the pillar section 15.

Here, the display panel includes a gate wire that is connected to the first picture element 230r, the second picture element 230g, and the third picture element 230b and extends in the above-mentioned lateral direction, and a data wire that is individually connected to each of the first picture element 230r, the second picture element 230g, and the third picture element 230b and extends in the above-mentioned longitudinal direction of the pillar section 15. The display panel also includes a signal wire (wire to supply electric power to the fourth picture element 230) that is connected to the fourth picture element 230 and extends in the above-mentioned lateral direction. Then, the gate wire, the data wire, and the signal wire are led out to the end of in the above-mentioned lateral direction the display panel.

This facilitates housing of the wiring region 113a within the pillar section 15 and electrical connection of the wiring region 113a (display panel 113p) with the circuit board 14 within the pillar section 15.

In addition, according to such arrangement of picture elements and wiring structure, a picture element row that extends along the lateral direction of the pillar section 15 is provided to enable the fourth picture element 230 to emit light and be controlled for each picture element row. In addition, since a picture element column in which the fourth picture elements 230 are continuously arranged extends in the longitudinal direction of the pillar section 15, a long light emitting region can be provided in the longitudinal direction of the pillar section 15.

In addition, when the pillar section 15 is provided between the windshield 202 and the door glass 203 of the vehicle, the fourth picture element 230 that does not illuminate the region 125 (as shown in FIG. 1B) is not required to emit light at high intensity. For example, the fourth picture element 230 close to a dashboard has little need to emit light at higher intensity than the fourth picture element 230 close to a backseat. In such a case, according to the arrangement of picture elements and the wiring structure of the embodiment 2, such control is possible that the intensity of a picture element row of the fourth picture elements 230 close to the dashboard is lowered, or emission of the fourth picture elements 230 close to the dashboard is prevented.

In addition, according to the picture element arrangement and the wiring structure of the embodiment 2, since the signal wire extends in the lateral direction of the pillar section, wiring length of the signal wire can be more controlled than in the case in which the signal wire extends in the longitudinal direction. More specifically, any effect of a voltage drop due to wiring length can be controlled.

[Modification]

Figure 11:
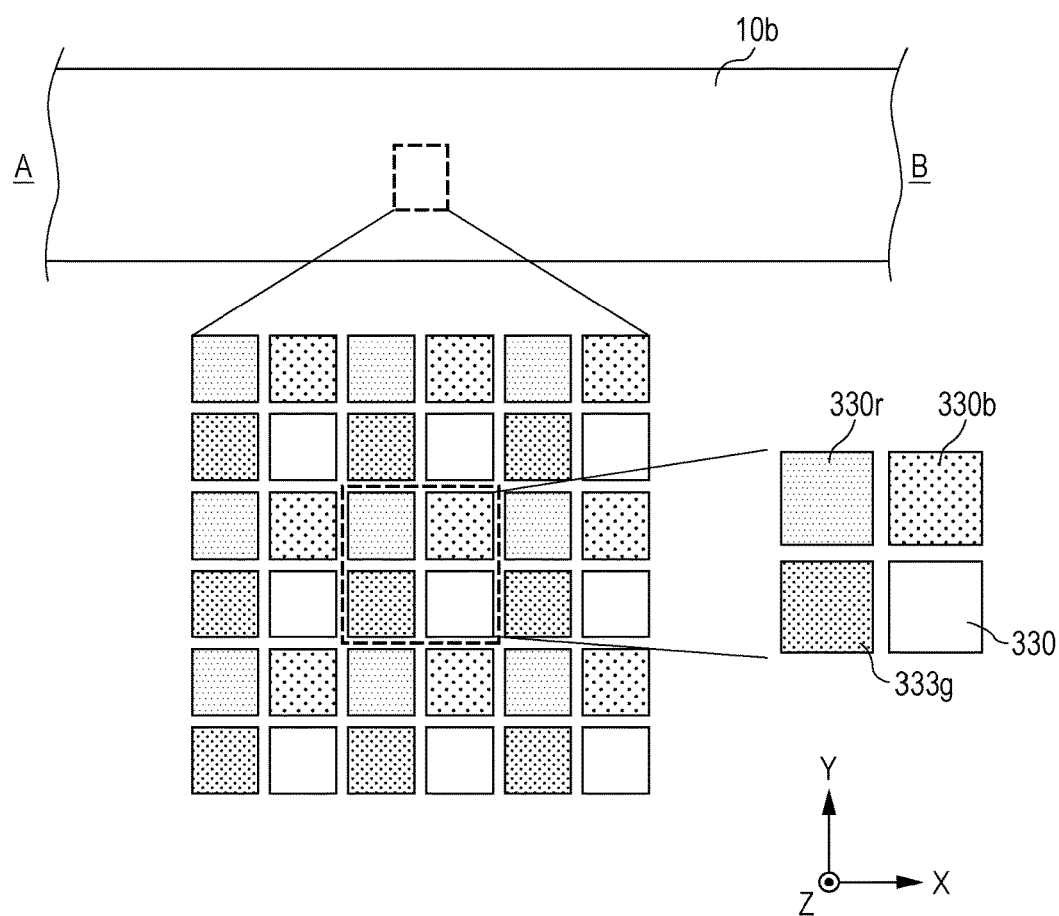
FIG. 11 is a view showing a first modification of picture element arrangement.

For example, the arrangements of picture elements described in the above embodiments are examples, and the present disclosure can be applied to the other picture element arrangements of various types. FIG. 11 is a view showing a modification of picture element arrangement.

In a display apparatus 10b as shown in FIG. 11, each picture element (a first picture element 330r, a second picture element 330g, a third picture element 330b, and a fourth picture element 330) is almost square shaped. In one picture element unit, the first picture element 330r, the second picture element 330g, the third picture element 330b, and the fourth picture element 330 are arranged in a matrix. Then, such picture element units are further arranged in a matrix.

Even in such picture element arrangement, if the first picture element 330r, the second picture element 330g, and the third picture element 330b are driven by the active matrix method and the fourth picture element 330 is driven by the passive method, the display apparatus 10b being attached to a pillar section 15 and capable of both image display and lighting is provided. In addition, since each wire is led out to an end in a Y direction, it facilitates housing of a wiring region within the pillar section 15 and electrically connection of the wiring region (display panel) with a circuit board 14 within the pillar section 15.

Figure 12:
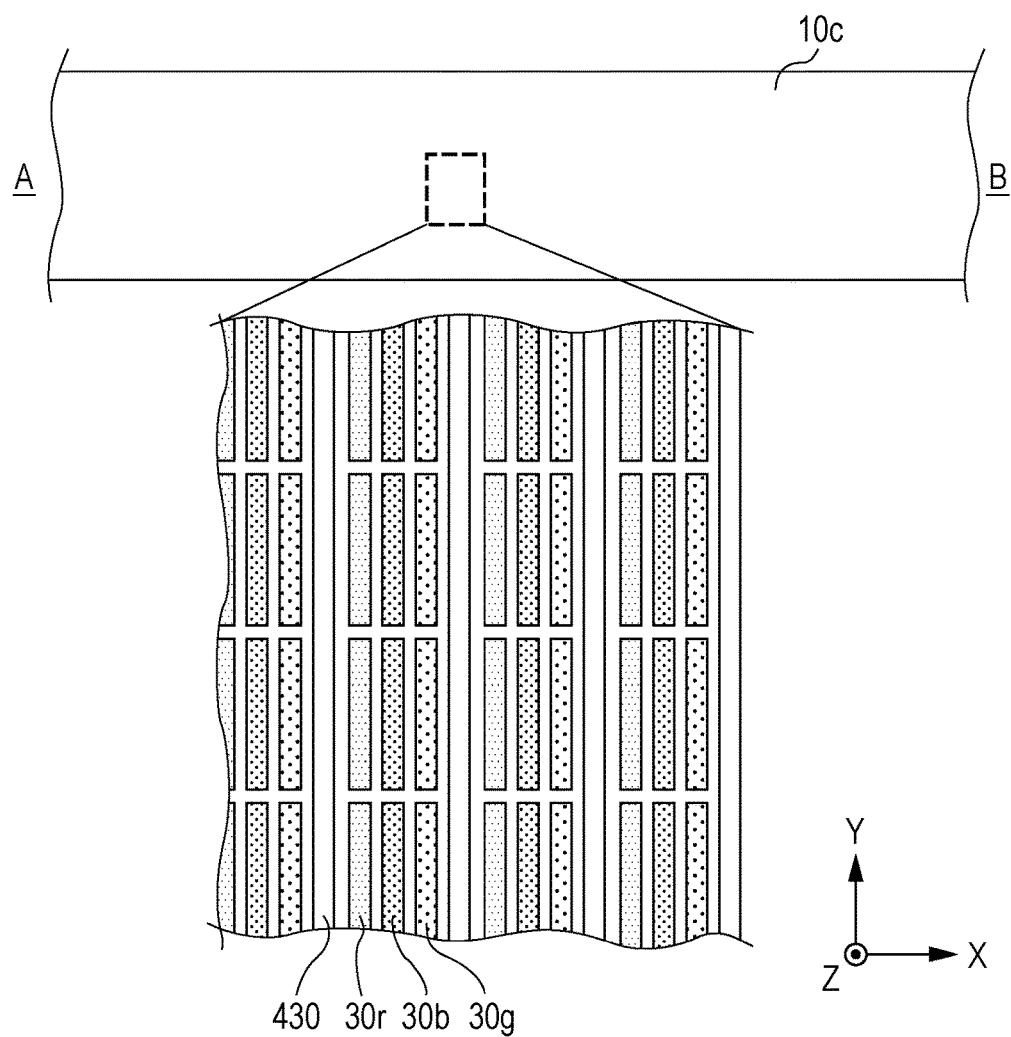
FIG. 12 is a view showing a second modification of picture element arrangement.

In addition, in the above embodiments, although each picture element is of the same size (area), each picture element may be different in size. In addition, the number of picture elements may be different depending on each type of a picture element. For example, the fourth picture element for lighting may be bigger and in a smaller number than picture elements for image display (the first picture element, the second picture element, and the third picture element). FIG. 12 is a view showing a modification of such picture element arrangement.

A display apparatus 10c shown in FIG. 12 has such a configuration that fourth picture elements 430 formed by connecting the plurality of fourth picture elements 30 of the display apparatus 10 described in the above embodiment are provided. More specifically, the fourth picture element 430 has a larger area (light emitting area) than any picture element of the first picture element 30r, the second picture element 30g, and the third picture element 30b. Then, the number of the fourth picture elements 430 is smaller than any picture element of the first picture element 30r, the second picture element 30g, and the third picture element 30b.

Since the fourth picture element 430 is a picture element for lighting, it is not required to be arranged at as high definition as picture elements for image display. Thus, by reducing the number of picture elements for lighting, a wiring structure and a method of driving the picture elements for lighting can be simplified.

Figure 13:
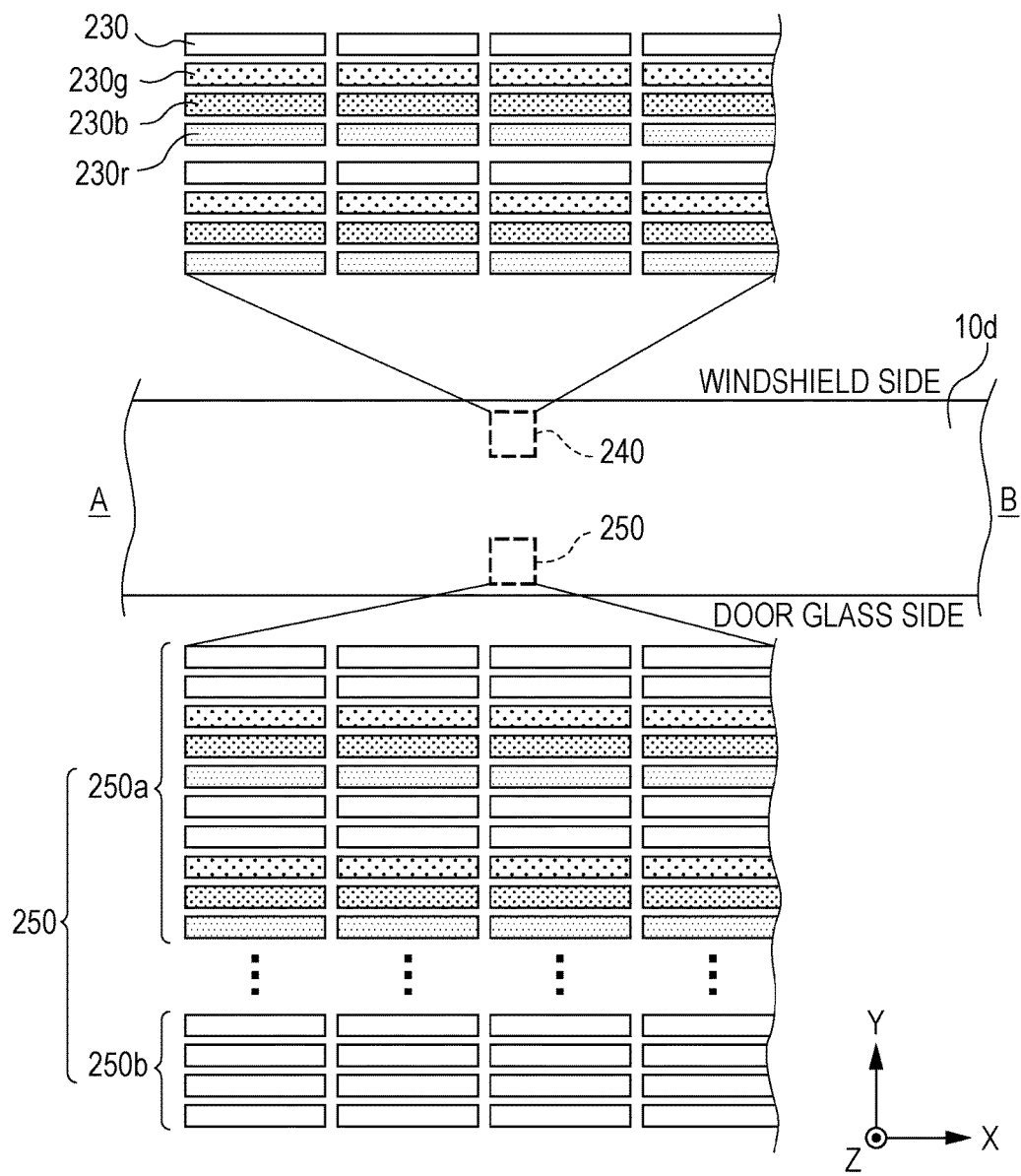
FIG. 13 is a view showing a third modification of picture element arrangement.

In addition, in the above embodiments, in the entire display region of the display apparatus, a proportion of the area of the fourth picture element per unit area is constant. However, the proportion of the area of the fourth picture element per unit area may be higher in a specific region than in another region. FIG. 13 is a view showing a modification of such picture element arrangement.

In a display apparatus 10d shown in FIG. 13, in a display region close to the door glass 203, the proportion of the area of the fourth picture element 230 (to the unit area) is higher than in the display region close to the windshield 202. Specifically, in a region 240 which is a display region close to the windshield 202, the proportion (ratio) of the areas of the first picture element 230r, the second picture element 230g, the third picture element 230b, and the fourth picture element 230 is 1:1:1:1. In contrast to this, in a region 250a of the region 250, which is a display region close to the door glass 203, the proportion of the areas of the first picture element 230r, the second picture element 230g, the third picture element 230b, and the fourth picture element 230 is 1:1:1:2. Note that as in FIG. 13, when size (area) of each picture element is equal, it can be said that in the display region close to the door glass 203, the number of the fourth picture elements 230 is larger than in the display region close to the windshield 202.

As described above, when the pillar section 15 is provided between the windshield 202 and the door glass 203 of the vehicle, the region 125 (as shown in FIG. 1B) is a main region to be illuminated and the fourth picture element 230 at a position that does not illuminate the region 125 is not required to emit light.

Therefore, such a configuration that the area of the fourth picture element 230 is large in the region 250 close to the door glass 203 which contributes to lighting to the region 125 enables effective illumination of the region to be illuminated.

In addition, of the display regions of the display apparatus 10d, if there is any region that cannot be visually recognized from the inside of the compartment, only the fourth picture element 230 may be provided in that region, rather than picture elements for image display being provided. For example, of the region 250, a region 250b close to the door glass 203 cannot be visually recognized from the inside of the compartment and thus there is no need to provide any picture element for image display in some cases. In such a case, as shown in FIG. 13, only the fourth picture element 230 may be provided in the region 250b.

Other Embodiments

As described above, although the display apparatuses according to the embodiments have been described, the present disclosure shall not be limited to the above-mentioned embodiments.

For example, in the above embodiment, as shown in FIG. 3A, although the wiring region is provided at one end of the Y direction of the display panel, the wiring region may be provided on both ends of the display panel in the Y direction. More specifically, the above-mentioned lead-out wires may be arbitrarily allotted to the one end and the other end of the two ends in the Y direction of the display panel.

In addition, in the above-mentioned embodiments, although the fourth picture element is driven for each picture element column by the passive method, the fourth picture element may be driven for each picture element by a simple matrix method, which is an example of the passive method.

In addition, when the display apparatus according to the above-mentioned embodiments is used as lighting, typically, only picture elements for lighting emit light, of picture elements for image display and those for lighting. However, when the above-mentioned display apparatus is used as lighting, the picture elements for image display may further emit light in addition to those for lighting. In this case, the above-mentioned first driving circuit 71 and the second driving circuit 72 may control such that a color emitted by the entire picture elements for image display based on a combination of a red light emitted by the first picture element, a green light emitted by the second picture element, and a blue light emitted by the third picture element matches (or approaches) a color emitted by the fourth picture element for lighting.

In addition, in the above embodiments, although the display apparatus is formed of a plurality of display panels, the display apparatus may be formed of one display panel. If a surface of such a structure as a pillar section to which the display apparatus is attached is a simple curved surface, even the display apparatus formed of one display panel can be attached in a state of being curved to the structure.

In addition, in the above embodiments, although the display apparatus is attached to the pillar section of the vehicle, the display apparatus may be attached to another pillar-shaped structure. The display apparatus may be provided as a display apparatus having a digital signage function and a lighting function, to be attached to a pillar of construction, for example.

So far while the display apparatuses according to one or more aspects are described, the present disclosure shall not be limited to the embodiments. A configuration in which various variations that occur to those skilled in the art are applied to the embodiments or that constructed by combining components in different embodiments may fall within the one or more aspects as far as they do not depart from the intent of the present disclosure.

What is claimed is:

1. A display apparatus comprising:
a plurality of flexible display panels structured to assume a curved shape and to be provided to a pillar of a vehicle along a lateral direction of the pillar, the plurality of flexible display panels including:
  a first picture element that emits a red light, a second picture element that emits a green light, a third picture element that emits a blue light, and a fourth picture element;
  a first wire connected to the first picture element, the second picture element, and the third picture element;
  a second wire connected to one of the first picture element, the second picture element, and the third picture element; and
  a third wire connected to the fourth picture element;
  wherein,
    each of the first picture element, the second picture element, and the third picture element is a picture element that includes an organic electroluminescent element as a light source and is driven by an active matrix method, and
    the fourth picture element is a picture element that includes an organic electroluminescent element as a light source and is driven by a passive method;
  in the plurality of flexible display panels, a region where the first picture element, the second picture element, the third picture element, and the fourth picture element are provided is defined as a display region;
  a region where the first picture element, the second picture element, the third picture element, and the fourth picture element are not provided and which is located at an end in the lateral direction is defined as a wiring region;
  the first wire, the second wire, and the third wire extend to the wiring region; and
  the wiring region is arranged within the pillar.

2. The display apparatus according to claim 1, wherein in the plurality of flexible display panels, the first picture element, the second picture element, the third picture element, and the fourth picture element are arranged side by side in a longitudinal direction of the pillar,
  the first wire extends in the longitudinal direction,
  the second wire extends in the lateral direction, and
  the third wire extends in the longitudinal direction or the lateral direction.

3. The display apparatus according to claim 1, wherein in the plurality of flexible display panels, the first picture element, the second picture element, the third picture element, and the fourth picture element are arranged side by side in the lateral direction,
  the first wire extends in the lateral direction,
  the second wire extends in a longitudinal direction of the pillar, and
  the third wire extends in the longitudinal direction or the lateral direction.

4. The display apparatus according to claim 1, wherein the first wire is a gate wire,
  the second wire is a data wire, and
  the third wire is a signal wire to supply electric power to the fourth picture element.

5. The display apparatus according to claim 1, wherein the pillar is provided between a windshield and a door glass of the vehicle,
  the display region includes a first region being adjacent to the door glass and a second region being adjacent to the windshield,
  an area of the first region is equal to that of the second region, and
  an area of the fourth picture element in the first region is larger than that in the second region.

6. The display apparatus according to claim 1, wherein at least a part of the wiring region of one of the plurality of flexible display panels is covered by the display region of another one of the plurality of flexible display panels.

7. The display apparatus according to claim 1, wherein in the plurality of flexible display panels, picture element units each including the first picture element, the second picture element, the third picture element, and the fourth picture element are arranged in a matrix.

8. The display apparatus according to claim 1, wherein the fourth picture element emits light in a same color as a single color that is obtainable by combining the red light emitted by the first picture element, the green light emitted by the second picture element, and the blue light emitted by the third picture element.

9. The display apparatus according to claim 1, wherein the first picture element, the second picture element, and the third picture element, and the fourth picture element are distinct from one another.

* * * * *